United States Patent
Yang et al.

(10) Patent No.: US 7,141,459 B2
(45) Date of Patent: Nov. 28, 2006

(54) SILICON-ON-INSULATOR ULSI DEVICES WITH MULTIPLE SILICON FILM THICKNESSES

(75) Inventors: Fu-Liang Yang, Hsin-Chu (TW); Hao-Yu Chen, Kaohsiung (TW); Yee-Chia Yeo, Singapore (SG); Carlos H. Diaz, Moundain View, CA (US); Chenming Hu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/388,297

(22) Filed: Mar. 12, 2003

(65) Prior Publication Data

US 2004/0180478 A1    Sep. 16, 2004

(51) Int. Cl.
*H01L 21/84* (2006.01)
*H01L 21/00* (2006.01)
*H01L 21/36* (2006.01)
*H01L 21/8238* (2006.01)

(52) U.S. Cl. ............... 438/154; 438/149; 438/151; 438/164; 438/165; 438/479

(58) Field of Classification Search ............... 438/149, 438/151, 152, 154, 164, 165, 458, 459, 479
See application file for complete search history.

(56) References Cited

U.S. PATENT DOCUMENTS

| | | | |
|---|---|---|---|
| 5,665,613 A * | 9/1997 | Nakashima et al. | 438/151 |
| 5,773,326 A * | 6/1998 | Gilbert et al. | 438/154 |
| 5,940,691 A * | 8/1999 | Manning | 438/151 |
| 5,952,695 A | 9/1999 | Ellis-Monaghan et al. | 257/347 |
| 6,096,584 A | 8/2000 | Ellis-Monaghan et al. | 438/151 |
| 6,222,234 B1 | 4/2001 | Imai | 257/347 |
| 6,383,924 B1 * | 5/2002 | Farrar et al. | 438/667 |
| 6,399,989 B1 | 6/2002 | Dockerty et al. | 257/347 |
| 6,403,435 B1 * | 6/2002 | Kang et al. | 438/311 |
| 6,404,015 B1 * | 6/2002 | Emmerik et al. | 257/348 |
| 6,414,355 B1 | 7/2002 | An et al. | 257/347 |
| 6,424,016 B1 * | 7/2002 | Houston | 257/407 |
| 6,448,114 B1 | 9/2002 | An et al. | 438/142 |
| 6,537,891 B1 * | 3/2003 | Dennison et al. | 438/406 |

OTHER PUBLICATIONS

Choi et al., "Ultra-Thin Body PMOSFET's with Selectively Deposited Ge Source/Drain", 2001 Symp. on VLSI Tech. Digest of Tech. Papers, pp. 19-20, 3A-2.
Chau et al., "A 50 nm Depleted-Substrate CMOS Transister (DST)", IEDM 01-621-IEDM01-623, IEEE 2001.

\* cited by examiner

*Primary Examiner*—Maria F. Guerrero
(74) *Attorney, Agent, or Firm*—Haynes and Boone, LLP (57) ABSTRACT

A method of forming a multiple-thickness semiconductor-on-insulator, comprising the following steps. A wafer is provided comprising a semiconductor film (having at least two regions) overlying a buried insulator layer overlying a substrate. The semiconductor film within one of the at least two regions is masked to provide at least one semiconductor film masked portion having a first thickness, leaving exposed the semiconductor film within at least one of the at least two regions to provide at least one semiconductor film exposed portion having the first thickness. In one embodiment, at least a portion of the at least one exposed semiconductor film portion is oxidized to provide at least one partially oxidized, exposed semiconductor film portion. Then the oxidized portion of the exposed semiconductor film is removed to leave a portion of the semiconductor film having a second thickness less than the first thickness.

62 Claims, 4 Drawing Sheets

SILICON-ON-INSULATOR ULSI DEVICES WITH MULTIPLE SILICON FILM THICKNESSES

FIELD OF THE INVENTION

The present invention relates generally to semiconductor fabrication and more specifically to semiconductor-on-insulator devices.

BACKGROUND OF THE INVENTION

The desire for higher performance circuits has driven the development of high-speed sub-100 nanometer (nm) silicon-on-insulator (SOI) complementary metal-oxide semiconductor (CMOS) technology. In SOI technology, transistors are formed on a thin layer of silicon overlying a layer of insulating material. Devices formed on SOI offer many advantages over their bulk counterparts, including absence of reverse body effect, absence of latch-up, soft-error immunity, and elimination of junction capacitance typically encountered in bulk silicon devices. SOI technology therefore enables higher speed performance, higher packing density, and reduced power consumption.

U.S. Pat. No. 5,952,695 to Ellis-Monaghan et al. discloses silicon-on-insulator and CMOS-on-SOI double film structures. Electrostatic discharge (ESD) characteristics of the SOI device is improved by having a thick double layer of silicon in selected regions.

U.S. Pat. No. 6,222,234 B1 to Imai discloses a semiconductor device with a fully-depleted SOI MOSFET and a partially-depleted SOI MOSFET on the same SOI substrate through isolation by an element isolation film.

U.S. Pat. Nos. 6,414,355 B1 and 6,448,114 B1 both to An et al. disclose, respectively, a silicon-on-insulator chip having an active layer of non-uniform thickness and a method of fabricating same.

U.S. Pat. No. 6,096,584 to Ellis-Monaghan et al. describes a silicon-on-insulator and CMOS-on-SOI double film fabrication process with a coplanar silicon and isolation layer and adding a second silicon layer on one region.

U.S. Pat. No. 6,399,989 to Dockerty et al. describes a radiation hardened silicon-on-insulator transistor.

The article entitled "Ultra-Thin Body PMOSFET's with Selectively Deposited Ge Source/Drain;" Yang-Kyu Choi et al.; 2001 *Symposium on VLSI Technology Digest of Technical Papers* held Jun. 12 to 14, 2001 in Kyoto Japan; pages 19 and 20; describes ultra-thin body MOSFETs with body thicknesses down to 4 µm and selectively deposited germanium (Ge) raised source and drains.

The article entitled "A 50 nm Depleted-Substrate CMOS Transistor (DST);" Robert Chau et al.; *International Electron Device Meeting* 2001 held Dec. 2 to 5, 2001 in Washington, D.C., pages 621 to 624; describes depleted-substrate transistor (DST) technology wherein depleted-substrate CMOS transistors were fabricated on thin silicon body ($\leq$30 nm) with physical gate lengths down to 50 nm which show steeper subthreshold slopes ($\leq$75 mV/decade) and improved DIBL ($\leq$50 mV/V) over both partially-depleted (P-D) SOI and bulk Si, for both PMOS and NMOS transistors.

SUMMARY OF THE INVENTION

Accordingly, it is an object of one or more embodiments of the present invention to provide a semiconductor-on-insulator chip with multiple semiconductor thicknesses.

It is another object of one or more embodiments of the present invention to provide a method of forming a silicon-on-insulator chip with two or more silicon thicknesses with good uniformity and reduced defects.

It is yet another object of one or more embodiments of the present invention to provide fully-depleted SOI devices and partially-depleted devices on the same substrate.

It is another object of one or more embodiments of the present invention to provide thick silicon films for the formation of SOI diodes with large current drives.

Other objects will appear hereinafter.

It has now been discovered that the above and other objects of the present invention may be accomplished in the following manner. Specifically, a wafer comprising a semiconductor film overlying a buried insulator layer overlying a substrate is provided with the semiconductor film including at least two regions. The semiconductor film within the least one of the at least two regions is masked to provide at least one semiconductor film masked portion having a first thickness, leaving exposed the semiconductor film within at least one of the at least two regions to provide at least one semiconductor film exposed portion having the first thickness. Then, in the first embodiment, at least a portion of the at least one exposed semiconductor film portion is oxidized to provide at least one partially oxidized, exposed semiconductor film portion. Then the oxidized portion of the exposed semiconductor film is removed to leave a portion of the semiconductor film having a second thickness less than the first thickness to form the multiple-thickness semiconductor-on-insulator. In the second embodiment, at least a portion of the at least one exposed semiconductor film portion is etched to provide at least one partially etched, exposed semiconductor film portion which is then partially oxidized to provide at least one partially oxidized, partially etched, exposed semiconductor film portion. The oxidized portion of the partially etched, exposed semiconductor film is removed to leave a portion of the semiconductor film having a second thickness less than the first thickness to form the multiple-thickness semiconductor-on-insulator.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Information Known to the Inventors—Not Prior Art

The following is known to the inventors and is not to be considered as prior art to the instant invention.

There are generally two types of SOI transistors: partially-depleted (PD) SOI transistor and fully-depleted (FD) SOI transistor. A PD-SOI transistor has a maximum depletion width that is smaller than the body thickness, and it therefore has a partially depleted body. PD-SOI transistors have the merit of being highly manufacturable, but they suffer from floating body effects. Digital circuits which typically have higher tolerance for floating body effects may employ PD-SOI transistors.

An FD-SOI transistor has a body which is fully depleted as the maximum depletion width is larger than its body thickness. FD-SOI devices avoid the problems of floating body effects with the use of a thinner silicon body thickness or a light body doping. Generally, analog circuitry performs better when designed using FD-SOI devices than using PD-SOI devices.

There is a need for mixed digital and analog signal SOI chips with regions suited for digital circuitry and regions suited for analog circuitry. Therefore, it is advantageous to provide at least two different silicon film thicknesses on the silicon-on-insulator chips. Regions with very thin silicon films may be employed for FD-SOI devices while regions while thicker silicon films may be used for PD-SOI devices. The availability of at least two different silicon body thicknesses also offers increased flexibility in circuit and device design.

In addition, SOI circuits, like other electronic circuits, are susceptible to electrostatic discharge (ESD). ESD occurs when there is a surge in voltage (positive or negative) that results when a large amount of current is applied to the circuit. For the purpose of providing ESD protection for circuits, ESD pulses have to be discharged by paths around the protected circuit. ESD protection schemes need a low voltage turn-on and a high current drive. A large current drive is needed to generate or sink a large amount of current before a large amount of negative or positive voltage is developed.

Traditional bulk over-voltage protection schemes, such as diode circuits on bulk substrates, do not work well on SOI substrates due to the presence of the SOI buried oxide. That is, conventional diodes fabricated on SOI have small current drives because the current is carried laterally and limited by the thickness of the semiconductor material. Thus, a thicker silicon thickness may be used to increase the lateral junction area of devices like a diode or a lubistor. This increase in the junction area would improve or increase the diode current drive. Furthermore, the thickness differential between different regions may be used to control other aspects of active devices, such as source/drain doping, junction capacitance, floating body effects, switching speed, etc.

It is advantageous to provide at least two different silicon film thicknesses for the SOI substrate. Regions with thicker silicon film may be used for making partially-depleted SOI devices, while regions with thinner silicon film may be used for making fully-depleted SOI devices.

In addition, thicker silicon films may also be used for selected devices, such as diodes or lubistors. A thicker silicon film thickness may be used to increase the lateral junction area of diodes or lubistors. This increase in junction area would improve, or increase, the current drive.

In this invention, a SOI technology having different silicon thicknesses is disclosed. This invention also teaches at least two methods of forming such a silicon-on-insulator substrate.

Figure 1:
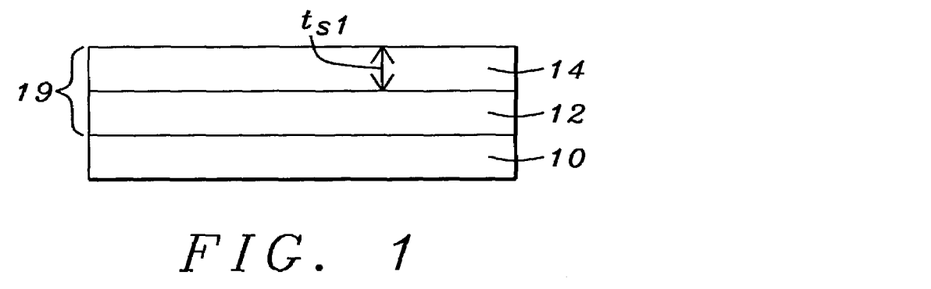
FIG. 1 schematically illustrates the initial structure common to the first and second embodiments of the present invention.

Initial Structure Common to Both Embodiments—FIG. 1

FIG. 1 schematically illustrates the initial structure common to the first and second embodiments of the present invention.

As shown in FIG. 1, an semiconductor-on-insulator (SOI) 19 is formed over structure 10. SOI 19 includes an overlying semiconductor film 14 and a buried insulator layer 12. The semiconductor film 14 may be any elemental semiconductor such as silicon and germanium, any alloy semiconductor such as silicon-germanium, or any compound semiconductor such as indium phosphide and gallium arsenide. In the preferred embodiment, the semiconductor film 14 is silicon. Buried insulator layer 12 is preferably silicon oxide, but may be comprised of any insulator such as silicon nitride and aluminum oxide.

Structure 10 is preferably a semiconductor wafer or substrate and is preferably silicon or germanium and is more preferably silicon.

Silicon film 14 has a thickness $t_{S1}$ of preferably from about 10 to 5000 Å and more preferably from about 10 to 2000 Å. Buried silicon oxide layer 12 has a thickness of preferably from about 50 to 10,000 Å and more preferably from about 50 to 2000 Å.

First Embodiment—FIGS. 2(a)–(d)

FIGS. 2(a)–(d) schematically illustrate a first preferred embodiment of the present invention. In the first preferred embodiment, at least one portion (within region 26) of the silicon film 14 is selectively thinned to a second thickness $t_{S2}$, using an oxidation process, while masking at least one other portion(s) (within region 28), leaving it/them at the original thickness $t_{S1}$. Isolation regions 20, 22, 24 may be/are formed after the thinning process(es) (see FIG. 4).

Figure 2A:
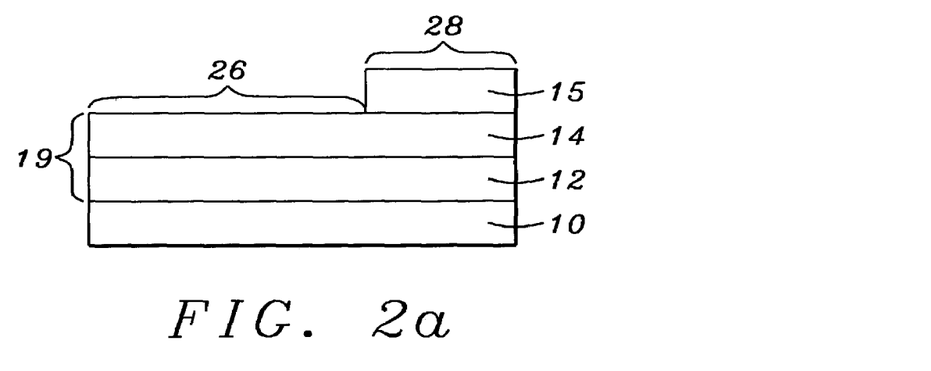
FIGS. 2(a)–(d) schematically illustrate a first preferred embodiment of the present invention.

Selective Masking—FIG. 2(a)

As shown in FIG. 2(a), SOI 19 includes at least two regions 26, 28. The silicon film 14 within one or more of regions 26, 28 is masked (e.g. within region 28 as shown in FIG. 2) leaving at least one region unmasked (e.g. region 26 as shown in FIG. 2(a). Mask 15 is preferably comprised of silicon nitride ($Si_3N_4$), and is more preferably comprised of a silicon nitride layer overlying a silicon oxide layer. The mask 15 may also be comprised of common masking materials known and used in the art.

Mask 15 may be formed by the oxidation of the silicon layer 14 using a dry oxidation process with a temperature from about 550° C. to 950° C., and then depositing a layer silicon nitride using chemical vapor deposition with silane and ammonia as precursor gases. Lithography and reactive ion etching may be used to pattern the mask 15 to give the structure as shown in FIG. 2(a).

Figure 2B:
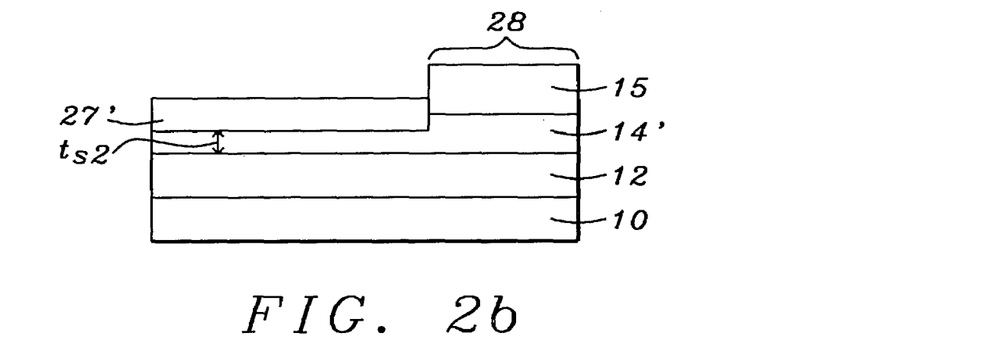

Selective Thinning of Silicon Film 14—FIG. 2(b)

As shown in FIG. 2(b), the silicon film 14 within the at least one region 26 that is unmasked, is thinned to a second thickness $t_{S2}$. The thinning process 17 is preferably an oxidation process such as: (1) a wet oxidation process employing an $H_2O$ and $O_2$ ambient at atmospheric pressure; or (2) a dry oxidation process employing an $O_2$ ambient at atmospheric pressure to convert a portion of the unmasked silicon film within region 26 to a silicon oxide layer portion 27'. The thickness uniformity is better than 2% after the thickness reduction.

The Wet Oxidation Process May be Conducted at:
a temperature: preferably from about 550 to 1100° C.; and
a time: of preferably from about 10 to 4000 seconds.
The Dry Oxidation Process May be Conducted at:
a temperature: preferably from about 550 to 1100° C.; and
a time: preferably from about 10 to 4000 seconds.

Removal of Silicon Oxide Layer Portion 27'

Figure 2C:
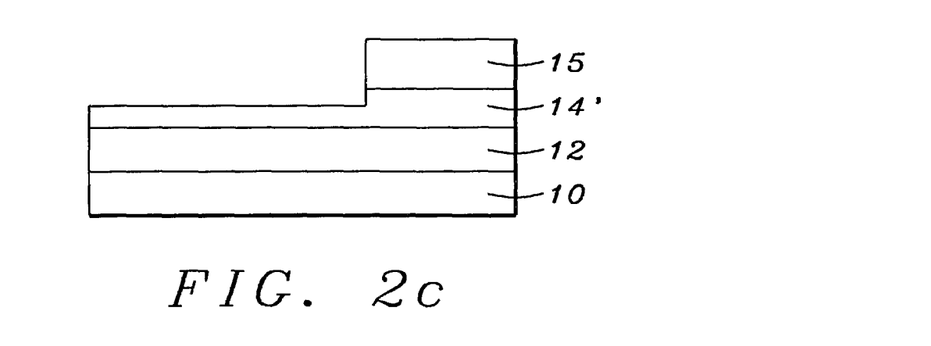

As shown in FIG. 2(c), the silicon oxide layer portion 27' is removed preferably using dilute hydrofluoric acid, such as that prepared by mixing 1 part of concentrated (49%) HF with 25 parts of water $H_2O$. The etch rate is about 100 Å per minute for thermally grown silicon oxide.

Removal of Mask 15

Figure 2D:
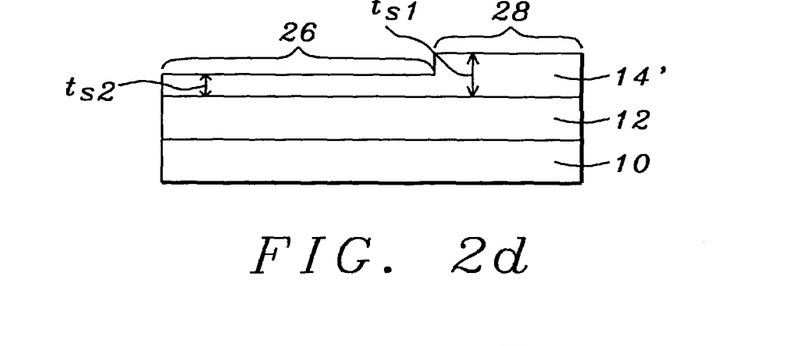

As shown in FIG. 2(d), any remaining mask(s) 15 is/are removed from over partially thinned silicon film 14' and the structure may be cleaned as necessary.

The exposed portion of the silicon film 14' within the at least one region 26 is preferably thinned from an initial thickness $t_{S1}$, of about 10 to 5000 Å and more preferably from about 10 to 1000 Å so that the its final thinned thickness $t_{S2}$ of preferably from about 5 to 500 Å and more preferably from about 5 to 100 Å.

While FIG. 2(d) illustrates an SOI having a silicon film 14' having two different thicknesses $t_{S1}$, $t_{S2}$, one skilled in the art can appreciate that the above steps may be repeated in a manner to form an SOI having three or more thicknesses of silicon film 14'. That is, for example, two or more regions may be exposed and the thinning process 17 repeated to further thin the first thinned silicon film 14' within the first thinned region 26 and to first thin a portion of the silicon film 14 within a second region while maintaining at least one mask over at least portion of the silicon film 14 with a third region 28.

The differential thickness ratio between thinned 26 and non-thinned regions 28 is preferably from about 5 to 80%.

Figure 4:
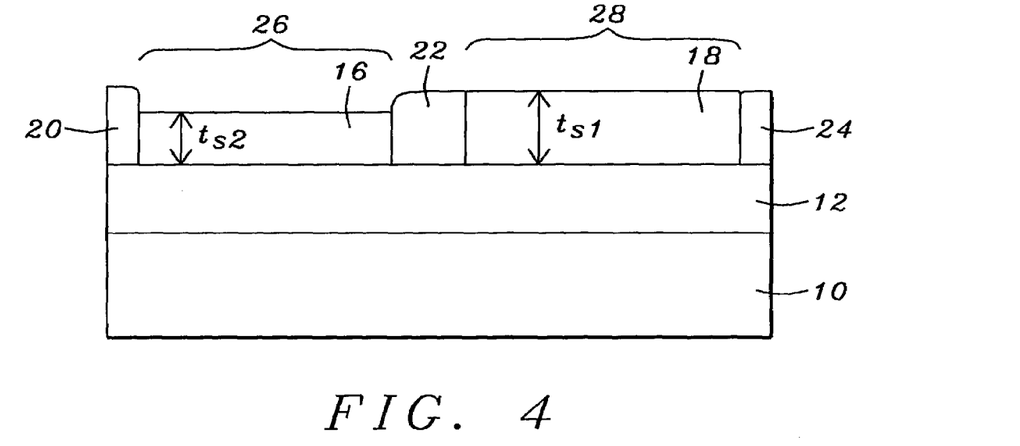
FIG. 4 schematically illustrates the formation of isolation regions in SOI substrate with multiple silicon thicknesses.

Removal of Mask(s) 15 and Formation of Isolation Regions 20, 22, 24—FIG. 4

As shown in FIG. 2(c) of the first embodiment and 3(c) of the second embodiment, the silicon oxide is removed using dilute hydrofluoric acid, such as that prepared by mixing 1 part of concentrated (49%) HF with 25 parts of water $H_2O$. The etch rate is about 100 angstroms per minute for thermally grown silicon oxide. Any remaining masks 15 are removed from over partially thinned silicon film 14' and the structure may be cleaned as necessary.

Second Embodiment—FIGS. 3(a)–(d)

FIGS. 3(a)–(d) schematically illustrate the second embodiment of this invention, wherein the thinning process 17 may also be a silicon etch process 17 followed by an anneal and/or oxidation process.

Figure 3A:
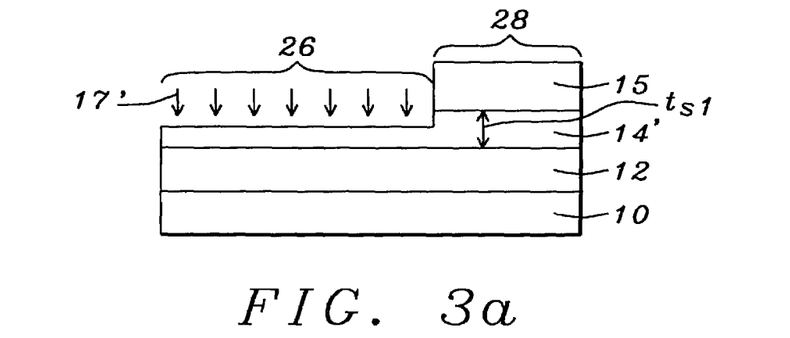
FIGS. 3(a)–(d) schematically illustrate a second preferred embodiment of the present invention.

Selective Masking—FIG. 3(a)

As shown in FIG. 3(a), SOI 19 includes at least two regions 26, 28. The silicon film 14 within one or more of regions 26, 28 is masked (e.g. within region 28 as shown in FIG. 2) leaving at least one region unmasked (e.g. region 26 as shown in FIG. 2). Mask 15 is preferably comprised of silicon nitride ($Si_3N_4$), and is more preferably comprised of a silicon nitride layer overlying a silicon oxide layer. The mask 15 may also be comprised of common masking materials known and used in the art.

Mask 15 may be formed by the oxidation of the silicon layer 14 using a dry oxidation process with a temperature from about 550° C. to 950° C., and then depositing a layer silicon nitride using chemical vapor deposition with silane and ammonia as precursor gases. Lithography and reactive ion etching may be used to pattern the mask 15 to give the structure as shown in FIG. 2(a).

Figure 3B:
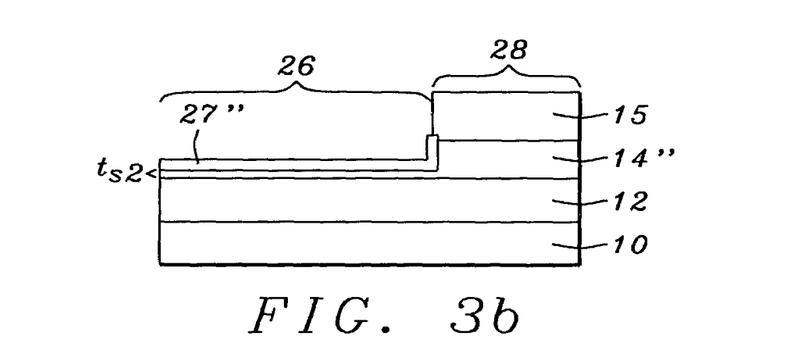
Figure 3C:
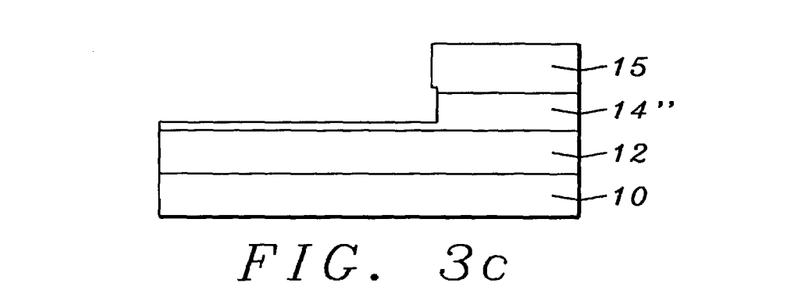

Selective Thinning of Silicon Film 14—FIGS. 3(a) and 3(b)

As shown in FIG. 3(a), to selectively thin the unmasked portion of the silicon layer 14 having an initial thickness $t_{S1}$ within region 26, that portion is first etched as at 17'.

The silicon etch process 17' may be performed by a plasma etch process known and used in the art. For example, reactive ion etching (RIE) using chlorine-based chemistry may be used to etch silicon. The anneal may be a hydrogen anneal at temperatures between 900 and 1200 degrees Celsius. The oxidation process may be a dry or wet oxidation. The oxidation temperature may range preferably from 550 to 1100° C., and the oxidation time may range preferably from about 10 to 4000 seconds.

As shown in FIG. 3(b), the exposed, etched portion of silicon film 14' is then selectively oxidized such as by (1) a wet oxidation process employing an $H_2O$ and $O_2$ ambient at atmospheric pressure; or (2) a dry oxidation process employing an $O_2$ ambient at atmospheric pressure to convert a portion of the unmasked, partially etched silicon film 14' within region 26 to a silicon oxide layer portion 27". The thickness uniformity is better than 2% after the thickness reduction. This reduces the thickness of the etched/oxidized portion of silicon film 14" within region 26 to thickness $t_{S2}$.

Removal of Silicon Oxide Layer Portion 27'

As shown in FIG. 3(c), the silicon oxide layer portion 27" is removed preferably using dilute hydrofluoric acid, such as that prepared by mixing 1 part of concentrated (49%) HF with 25 parts of water $H_2O$. The etch rate is about 100 Å per minute for thermally grown silicon oxide.

Removal of Mask 15

Figure 3D:
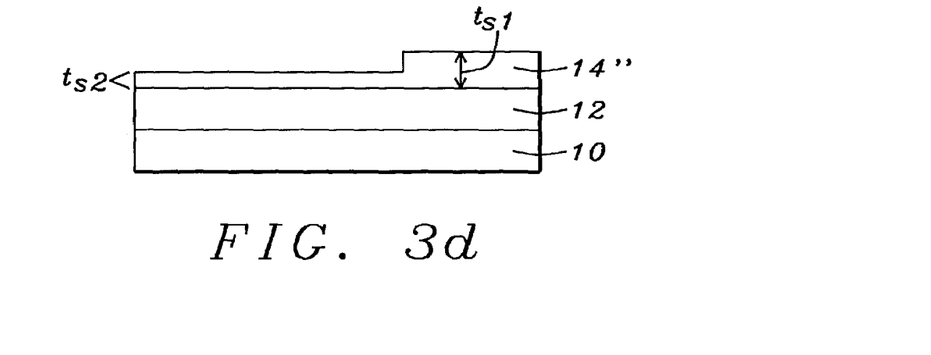

As shown in FIG. 3(d), any remaining mask(s) 15 is/are removed from over partially thinned silicon film 14" and the structure may be cleaned as necessary.

Formation of Isolation Regions in SOI Substrate 19 Having Multiple Silicon Layer 14', 14" Thicknesses FIG. 4 illustrates the cross-section of a portion of the substrate after the formation of isolation regions 20, 22, 24.

The partially thinned silicon film 14'/14" may then be patterned and isolation devices 20, 22, 24 are formed between each region 26, 28 and segregating the partially thinned silicon film 14'/14" into thinner silicon film portions 16 and thicker silicon film portions 18.

Isolation regions 20, 22, 24 may be shallow trench isolation (STI) and are preferably comprised of silicon oxide.

Figure 5:
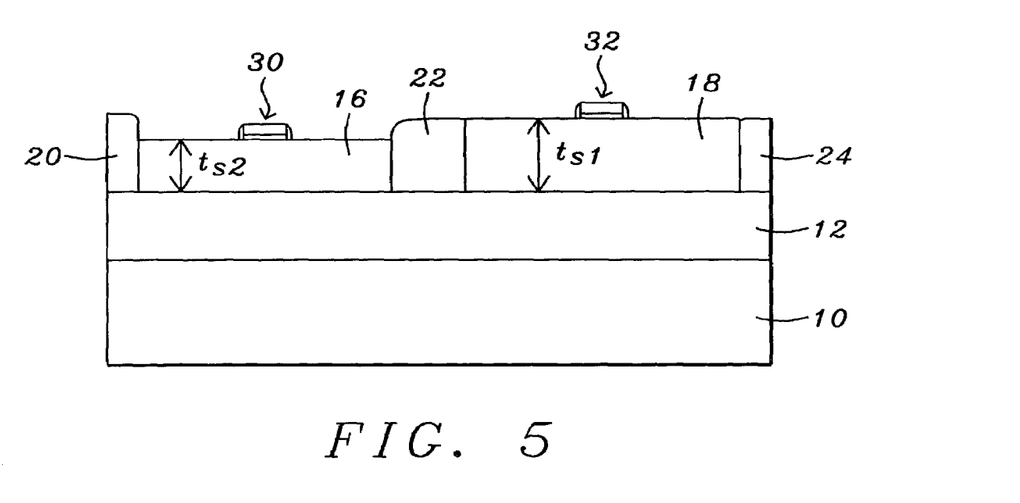
FIG. 5 schematically illustrates the formation of devices in the SOI substrate.
Figure 6A:
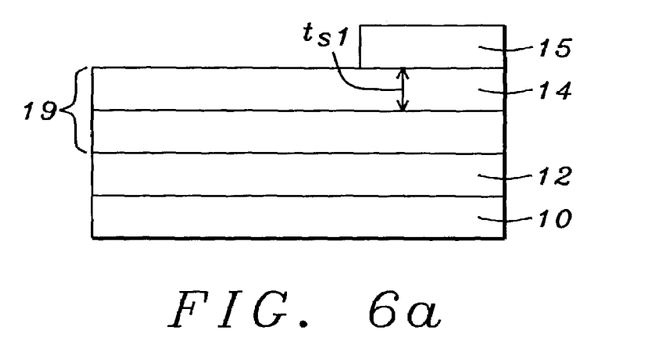
FIGS. 6(a)–(d) schematically illustrate the use of the first or second embodiment to form a multi-thickness semiconductor-on-insulator film.
Figure 6B:
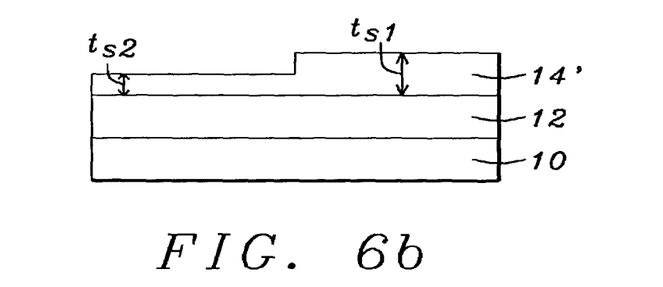
Figure 6C:
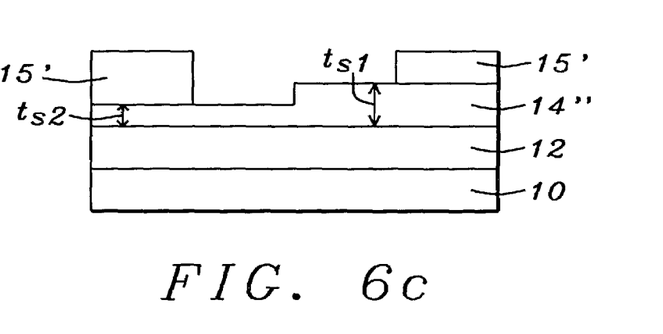
Figure 6D:
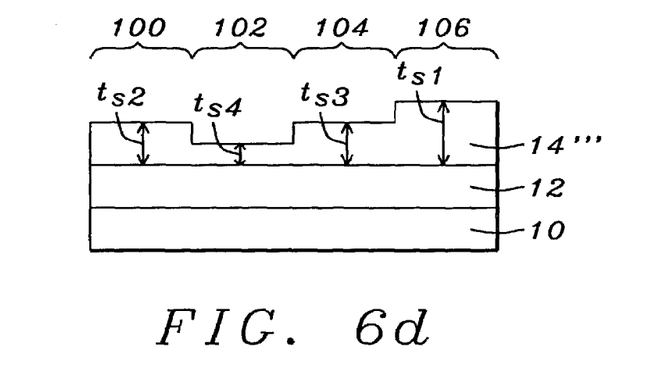

Formation of Devices 30, 32—FIG. 5

As shown in FIG. 5, respective devices 30, 32 may then be formed over the different thickness silicon film portions 16, 18 within regions 26, 28. For example, a fully-depleted SOI field effect transistor 30 may be formed over thinned silicon film portion 16 within region 26 and a partially-depleted SOI transistor may be formed over non-thinned silicon film portion 18 within region 28.

Other devices may also be formed upon the silicon film portions 16, 18, such as N-channel devices, diode devices or lubistors. Fully-depleted SOI devices are preferably formed within the thinned silicon film portion 16 and partially-depleted SOI devices are formed within the thicker silicon film portion 18 such as transistors, body-contact devices and diodes.

Sample FIGS. 6(a)–(d) Illustrating Formation of Multiple-Thickness Semiconductor Film Layer Portions As shown in FIGS. 6(a)–(d), multiple-thickness semiconductor film layer 14''' portions within regions 100, 102, 104, 106 may be formed in accordance with either the first or second embodiments of the present invention having respective thicknesses $t_{S1}$, $t_{S4}$, $t_{S3}$, $t_{S1}$ by using, for example, a second mask 15' in accordance with the disclosure/teachings herein.

ADVANTAGES OF THE PRESENT INVENTION

The advantages of one or more embodiments of the present invention include:
1. a new method to obtain silicon-on-insulator substrates with multiple silicon thicknesses;
2. For the first embodiment: the use of oxidation of silicon to reduce the thickness of silicon in selected portions of the SOI substrate as oxidation introduces less defects and is more uniform than an etch process; and
3. For the second embodiment: a combination of anneal and oxidation to reduce silicon thickness in selected regions of SOI substrate.

While particular embodiments of the present invention have been illustrated and described, it is not intended to limit the invention, except as defined by the following claims.

We claim:

1. A method of forming a multiple-thickness semiconductor-on-insulator, comprising:
   providing a wafer, the wafer comprising a semiconductor film overlying a buried insulator layer overlying a substrate;
   the semiconductor film including at least two regions;
   masking the semiconductor film within the least one of the at least two regions to provide at least one semiconductor film masked portion having a first thickness, leaving exposed the semiconductor film within at least one of the at least two regions to provide at least one semiconductor film exposed portion having the first thickness;
   oxidizing at least a portion of the at least one exposed semiconductor film portion to provide at least one partially oxidized, exposed semiconductor film portion; and
   removing the oxidized portion of the exposed semiconductor film to leave a portion of the semiconductor film having a second thickness less than the first thickness to form the multiple-thickness semiconductor-on-insulator;
   masking at least a portion of the second thickness semiconductor film or the first thickness semiconductor film leaving exposed a portion of the other thickness semiconductor film;
   partially oxidizing the exposed portion of the other thickness semiconductor film; and
   removing the partially oxidized portion of the other thickness semiconductor film to form a portion of the other thickness semiconductor film having a third thickness that is different from the first and second thicknesses.

2. The method of claim 1, wherein the substrate is one of a silicon semiconductor material and a germanium semiconductor material.

3. The method of claim 1, wherein the buried insulator layer is one of silicon oxide, silicon nitride and aluminum oxide.

4. The method of claim 1, wherein the first thickness of the semiconductor film is from about 10 to 5000 Å, and the buried insulator layer has a thickness of from about 50 to 10,000 Å.

5. The method of claim 1, wherein the first thickness of the semiconductor film is from about 10 to 2000 Å, and the buried insulator layer has a thickness of from about 50 to 2000 Å.

6. The method of claim 1, wherein the semiconductor film is masked using a patterned masking layer.

7. The method of claim 1, wherein the semiconductor film is masked using a patterned masking layer; the patterned masking layer being one of silicon nitride and a silicon nitride/silicon oxide stack.

8. The method claim 1, including unmasking the at least one semiconductor film masked portion after treatment of the at least one semiconductor film exposed portion.

9. The method of claim 1, including forming at least one isolation device within the semiconductor film to segregate the at least one semiconductor film masked portion from the at least one semiconductor film exposed portion.

10. The method of claim 1, including forming at least one isolation device within the semiconductor film to segregate the at least one semiconductor film masked portion from the at least one semiconductor film exposed portion; the at least one isolation device being comprised of silicon oxide.

11. The method of claim 1, wherein the first thickness is from about 10 to 5000 Å.

12. The method of claim 1, wherein the first thickness is from about 10 to 2000 Å.

13. The method of claim 1, including unmasking the at lent one semiconductor film masked portion;
   forming a first device upon the at least one untreated, unmasked semiconductor film portion; and
   forming a second device upon the at least one exposed semiconductor film portion.

14. The method of claim 1, including unmasking the at least one semiconductor film masked portion;
   forming a first device upon the at least one untreated, unmasked semiconductor film portion; and
   forming a second device upon the at least one exposed semiconductor film portion; the first device being a partially-depleted SOI device and the second device being a fully-depleted SOI device.

15. The method of claim 1, wherein the oxidation of the at least one semiconductor film being is carried out using one of a wet oxidation process employing an $H_2O$ and $O_2$ ambient, and a dry oxidation process employing an $O_2$ ambient.

16. The method of claim 1, wherein the oxidation of the at least one semiconductor film is one of a wet oxidation process and a dry oxidation process, and comprises processing from about 10 to 4000 seconds.

17. The method of claim 1, wherein the second thickness is from about 5 to less than 500 Å.

18. The method claim 1, wherein the removing of the oxidized portion of the exposed semiconductor film is carried out using hydrofluoric acid.

19. The method of claim 17, wherein the second thickness is from about 5 to 100 Å.

20. The method of claim 18, wherein the hydrofluoric acid comprises prepared the hydrofluoric acid by mixing 1 part of concentrated (49%) HF with 25 parts of water $H_2O$.

21. The method of claim 18, wherein the hydrofluoric acid has an etch rate about 100 angstroms per minute for thermally grown silicon oxide.

22. A method of forming a multiple-thickness semiconductor-on-insulator, comprising:
providing a wafer; the wafer comprising a semiconductor film overlying a buried insulator layer overlying a substrate;
the semiconductor film including at least two regions;
masking the semiconductor film within the least one of the at least two regions to provide at least one semiconductor film masked portion having a first thickness of from about 10 to 5000 Å, leaving exposed the semiconductor film within at least one of the at least two regions to provide at least one semiconductor film exposed portion having the first thickness;
oxidizing at least a portion of the at least one exposed semiconductor film portion to provide at least one partially oxidized, exposed semiconductor film portion;
removing the oxidized portion of the exposed semiconductor film to leave a portion of the semiconductor film having a second thickness of from about 5 to 500 Å to form the multiple-thickness semiconductor-on-insulator;
masking at lest a portion of the second thickness semiconductor film or the first thickness semiconductor film leaving exposed a portion of the other thickness semiconductor film;
partially oxidizing the exposed portion of the other thickness semiconductor film; and
removing the partially oxidized portion of the other thickness semiconductor film to form a portion of the other thickness semiconductor film having a third thickness that is different from the first and second thickness.

23. The method of claim 22, wherein the substrate is one of a silicon semiconductor material and a germanium semiconductor material.

24. The method of claim 22, wherein the buried insulator layer is one of silicon oxide, silicon nitride and aluminum oxide.

25. The method of claim 22, wherein the first thickness of the semiconductor film is from about 10 to 5000 Å, and the buried insulator layer has a thickness of from about 50 to 10,000 Å.

26. The method of claim 22, wherein the first thickness of the semiconductor film is from about 10 to 2000 Å, and the buried insulator has a thickness of from about 50 to 2000 Å.

27. The method of claim 22, wherein the semiconductor film is masked using a patterned masking layer.

28. The method of claim 22, wherein the semiconductor film is masked using a patterned masking layer the patterned masking layer being one of silicon nitride and a silicon nitride/silicon oxide stack.

29. The method of claim 22, wherein the second thickness is from about 5 to 100 Å.

30. The method claim 22, including unmasking the at least one semiconductor film masked portion after treatment of the at least one semiconductor film exposed portion.

31. The method of claim 22, including forming at least one isolation device within the semiconductor film to segregate the at least one semiconductor film masked potion from the at least one semiconductor film exposed portion.

32. The method of claim 22, including forming at least one isolation device within the semiconductor film to segregate the at least one semiconductor film masked portion from the at least one semiconductor film exposed portion; the at least one isolation device being comprised of silicon oxide.

33. The method of claim 22, wherein the first thickness is from about 10 to 5000 Å.

34. The method of claim 22, wherein the first thickness is from about 10 to 2000 Å.

35. The method of claim 22, including:
unmasking the at least one semiconductor film masked portion;
forming a first device upon the at least one untreated, unmasked semiconductor film portion; and
forming a second device upon the at least one exposed semiconductor film portion.

36. The method of claim 22, including:
unmasking the at least one semiconductor film masked portion;
forming a first device upon the at least one untreated, unmasked semiconductor film portion; and
forming a second device upon the at least one exposed semiconductor film portion; the first device being a partially-depleted SQI device and the second device being a fully-depleted SOI device.

37. The method of claim 22, wherein the oxidation of the at least one semiconductor film is carried out using one of a wet oxidation process employing an $H_2$ and $O_2$ ambient, and a dry oxidation process employing an $O_2$ ambient.

38. The method of claim 22, wherein the oxidation of the at least one semiconductor film is one of a wet oxidation process and a dry oxidation process, and comprises processing from about 10 to 4000 seconds.

39. The method of claim 22, wherein the removing of the oxidized portion of the exposed semiconductor film is carried out using hydrofluoric acid.

40. The method of claim 39, wherein the hydrofluoric acid comprises prepared the hydrofluoric acid by mixing 1 part of concentrated (49%) HF with 25 parts of water $H_2O$.

41. The method of claim 39, wherein the hydrofluoric acid has an etch rate about 100 angstroms per minute for thermally grown silicon oxide.

42. A method of forming a multiple-thickness semiconductor-on-insulator, comprising:
providing a wafer; the wafer comprising a semiconductor film overlying a buried insulator layer overlying a substrate;
the semiconductor film including at least two regions;
masking the semiconductor film within the least one of the at least two regions to provide at least one semiconductor film masked portion having a first thickness, leaving exposed the semiconductor film within at least one of the at least two regions to provide at least one semiconductor film exposed portion having the first thickness;
etching at least a portion of the at least one exposed semiconductor film portion to provide at least one partially etched, exposed semiconductor film portion;
oxidizing at least a portion of the partially etched, exposed semiconductor film portion to provide at least one partially oxidized, partially etched, exposed semiconductor film portion; and
removing the oxidized portion of the partially etched, exposed semiconductor flint to leave a portion of the semiconductor film having a second thickness less than the first thickness to form the multiple-thickness semiconductor-on-insulator;
masking at least a portion cite second thickness semiconductor film or the first thickness semiconductor film leaving exposed a portion cite other thickness semiconductor film;

partially etching the exposed portion of the other thickness semiconductor film;

partially oxidizing the second partially etched exposed portion cite other thickness semiconductor film; and removing the partially oxidized portion of the other thickness semiconductor film to form a portion of the other thickness semiconductor film having a third thickness that is different from the first and second thickness.

43. The method of claim 42, wherein the substrate is one of a silicon semiconductor material and a germanium semiconductor material.

44. The method of claim 42, wherein the buried insulator layer is one of silicon oxide, silicon nitride and aluminum oxide.

45. The method of claim 42, wherein the first thickness of the semiconductor film is from about 10 to 5000 Å, and the buried insulator layer has a thickness of from about 50 to 10,000 Å.

46. The method of claim 42, wherein the first thickness of the semiconductor film is from about 10 to 2000 Å, and the buried insulator has a thickness of from about 50 to 2000 Å.

47. The method of claim 42, wherein the semiconductor film is masked using a patterned masking layer.

48. The method of claim 42, wherein the semiconductor film is masked using a patterned masking layer, the patterned masking layer being one of silicon nitride and a silicon nitride/silicon oxide stack.

49. The method claim 42, including unmasking the at least one semiconductor film masked portion after treatment of the at least one semiconductor film exposed portion.

50. The method of claim 42, including forming at least one isolation device within the semiconductor film to segregate the at least one semiconductor film masked portion from the at least one semiconductor film exposed portion.

51. The method of claim 42, including forming at least one isolation device within the semiconductor film to segregate the at lent one semiconductor film masked portion from the at least one semiconductor film exposed portion; the at least one isolation device being comprised of silicon oxide.

52. The method of claim 42, wherein the first thickness is from about 10 to 5000 Å.

53. The method of claim 42, wherein the first thickness is from about 10 to 2000 Å.

54. The method of claim 42, including:

unmasking the at least one semiconductor film masked portion;

forming a first device upon the at least one untreated, unmasked semiconductor film portion; and forming a second device upon the at least one exposed semiconductor film portion.

55. The method of claim 42, including:

unmasking the at least one semiconductor film masked portion;

forming a first device upon the at least one untreated, unmasked semiconductor film portion; and forming a second device upon the at least one exposed semiconductor film portion; the first device being a partially-depleted SOI device and the second device being a fully-depleted SOI device.

56. The method of claim 42, wherein the oxidation of the at least one semiconductor film is carried out using one of a wet oxidation process employing an $H_2O$ and $O_2$ ambient, and a dry oxidation process employing an $O_2$ ambient.

57. The method of claim 42, wherein the oxidation of the at least one semiconductor film is one of a wet oxidation process and a dry oxidation process, and comprises processing from about 10 to 4000 seconds.

58. The method of claim 42, wherein the second thickness is from about 5 to less than 500 Å.

59. The method of claim 42, wherein the removing of the oxidized portion of the exposed semiconductor film is carried out using hydrofluoric acid.

60. The method of claim 58, wherein the second thickness is from about 5 to 100 Å.

61. The method of claim 59, wherein the hydrofluoric acid comprises prepared the hydrofluoric acid by mixing 1, part of concentrated (49%) HF with 25 parts of water $H_2O$.

62. The method of claim 59, wherein the hydrofluoric acid has an etch rate about 100 angstroms per minute for thermally grown silicon oxide.

* * * * *